(12) United States Patent
Dupont (10) Patent No.: US 11,677,049 B2
(45) Date of Patent: Jun. 13, 2023

(54) OPTOELECTRONIC DEVICE

(71) Applicant: Aledia, Grenoble (FR)

(72) Inventor: Tiphaine Dupont, Grenoble (FR)

(73) Assignee: Aledia, Grenoble (FR)

( * ) Notice: Subject to any disclaimer, the term of this patent is extended or adjusted under 35 U.S.C. 154(b) by 101 days.

(21) Appl. No.: 16/626,277

(22) PCT Filed: Jun. 8, 2018

(86) PCT No.: PCT/EP2018/065136
§ 371 (c)(1),
(2) Date: Dec. 23, 2019

(87) PCT Pub. No.: WO2019/001927
PCT Pub. Date: Jan. 3, 2019

(65) Prior Publication Data
US 2020/0119233 A1 Apr. 16, 2020

(30) Foreign Application Priority Data
Jun. 27, 2017 (FR) ...................... 1755898

(51) Int. Cl.
*H01L 33/50* (2010.01)
*H01L 25/075* (2006.01)
(Continued)

(52) U.S. Cl.
CPC ............ *H01L 33/504* (2013.01); *G02B 1/005* (2013.01); *H01L 25/0753* (2013.01);
(Continued)

(58) Field of Classification Search
CPC ....... H01L 33/504; H01L 33/50; H01L 33/60; H01L 2933/0041; H01L 2933/0083;
(Continued)

(56) References Cited

U.S. PATENT DOCUMENTS 6,999,669 B2 * 2/2006 Summers ............... B82Y 20/00
385/131
7,442,964 B2 * 10/2008 Wierer, Jr. ........... G02B 6/1225
257/98
(Continued)

FOREIGN PATENT DOCUMENTS

TW          1588984 B      6/2017

OTHER PUBLICATIONS

International Preliminary Report for Patentability for International Application No. PCT/EP2018/065136, dated Jan. 9, 2020.
(Continued)

*Primary Examiner* — Erik T. K. Peterson
(74) *Attorney, Agent, or Firm* — Wolf, Greenfield & Sacks, P.C.

(57) ABSTRACT

An optoelectronic device, including: light-emitting sources, each light-emitting source being capable of emitting a first radiation at a first wavelength; photoluminescent blocks distributed into first photo-luminescent blocks capable of converting by optical pumping the first radiation into a second radiation at a second wavelength and second photoluminescent blocks capable of converting by optical pumping the first radiation into a third radiation at a third wavelength; and for each photoluminescent block, an optical coupler including a first photonic crystal at least partially surrounding the photoluminescent block and covering, with the photo-luminescent block, one of the light-emitting sources next to the photoluminescent block, the optical coupler being capable of modifying the propagation direction of rays of the first radiation emitted by the light-emitting source to redirect the rays towards the photoluminescent block.

13 Claims, 5 Drawing Sheets

(51) Int. Cl.
*H01L 33/60* (2010.01)
*G02B 1/00* (2006.01)
*G02B 6/122* (2006.01)

(52) U.S. Cl.
CPC .............. *H01L 33/50* (2013.01); *H01L 33/60* (2013.01); *G02B 6/1225* (2013.01); *H01L 2933/0041* (2013.01); *H01L 2933/0058* (2013.01); *H01L 2933/0083* (2013.01)

(58) Field of Classification Search
CPC ........ H01L 2933/0058; H01L 25/0753; G02B 1/005; G02B 6/1225; G02F 2202/32
See application file for complete search history.

(56) References Cited

U.S. PATENT DOCUMENTS

| | | | | |
|---|---|---|---|---|
| 2006/0120414 | A1* | 6/2006 | Hori | G02F 1/37 372/21 |
| 2007/0025673 | A1* | 2/2007 | Bose | B82Y 20/00 385/129 |
| 2007/0085100 | A1* | 4/2007 | Diana | H01L 33/20 257/98 |
| 2007/0237479 | A1* | 10/2007 | Seol | B82Y 20/00 385/129 |
| 2007/0267646 | A1* | 11/2007 | Wierer, Jr. | C04B 35/597 257/98 |
| 2008/0283864 | A1* | 11/2008 | LeToquin | H01L 33/505 257/101 |
| 2009/0059406 | A1* | 3/2009 | Powers | G02B 6/0229 359/889 |
| 2011/0025951 | A1* | 2/2011 | Jones | H01L 33/50 349/70 |
| 2011/0215355 | A1* | 9/2011 | van de Ven | H01L 33/505 257/98 |
| 2011/0297975 | A1* | 12/2011 | Yeh | H04N 9/315 257/88 |
| 2012/0018764 | A1* | 1/2012 | Choi | H01L 33/382 257/99 |
| 2014/0001503 | A1* | 1/2014 | Ahlstedt | H01L 33/46 257/98 |
| 2014/0153216 | A1* | 6/2014 | Yamanaka | C09K 11/025 362/84 |
| 2014/0353702 | A1* | 12/2014 | Nagao | F21S 41/16 257/98 |
| 2017/0023188 | A1* | 1/2017 | Mima | C09K 11/7706 |
| 2017/0263828 | A1 | 9/2017 | Mao et al. | |
| 2020/0279979 | A1* | 9/2020 | Lee | H01L 25/0753 |

OTHER PUBLICATIONS

International Search Report and Written Opinion for International Application No. PCT/EP2018/065136, dated Aug. 14, 2018.

* cited by examiner

OPTOELECTRONIC DEVICE

RELATED APPLICATIONS

This application is a national stage filing under 35 U.S.C. § 371 of International Patent Application Ser. No. PCT/EP2018/065136, filed Jun. 8, 2018, which claims priority to French patent application number 17/55898, the contents of these applications are which is hereby incorporated here by reference in their entirety.

BACKGROUND

The present disclosure concerns an optoelectronic device, particularly a display screen or an image projection device, comprising light-emitting sources, particularly light-emitting diodes based on semiconductor materials, and to methods of manufacturing the same.

DISCUSSION OF THE RELATED ART

A pixel of an image corresponds to the unit element of the image displayed by the optoelectronic device. When the optoelectronic device is a color image display screen, it generally comprises, for the display of each pixel of the image, at least three components, also called display sub-pixels, which each emit a light radiation substantially in a single color (for example, red, green, and blue). The superposition of the radiations emitted by the three display sub-pixels provides the observer with the colored sensation corresponding to the pixel of the displayed image. In this case, the assembly formed by the three display sub-pixels used to display a pixel of an image is called display pixel of the optoelectronic device.

There exist optoelectronic devices comprising light-emitting diodes based on semiconductor materials, particularly light-emitting diodes based on semiconductor materials, and blocks of photoluminescent materials covering at least some of the light-emitting sources. Each photoluminescent block is capable of converting the radiation emitted by the associated light-emitting source, or first radiation, into a radiation at the desired wavelength, or second radiation.

The luminous efficacy of an optoelectronic device is defined as the ratio of the light flow emitted by the optoelectronic device towards the outside to the electric power consumed by the light-emitting sources of the optoelectronic device.

A disadvantage of the previously-described optoelectronic devices is that part of the radiation emitted by the light-emitting sources is generally not converted by the associated photoluminescent blocks and generally has to be blocked by a filter covering the photoluminescent blocks. It is however not desirable to excessively increase the thickness of the photo-luminescent block to increase the proportion of the first radiation converted into the second radiation. Indeed, this increases the average travel time of the second radiation in the photoluminescent block and causes an increase of the re-absorption of the second radiation in the photoluminescent block. The luminous efficacy of the optoelectronic device may thus be low.

A disadvantage of the previously-described optoelectronic devices is that the manufacturing cost of the materials forming the photoluminescent blocks may be high.

SUMMARY

Thus, an object of an embodiment is to overcome at least part of the disadvantages of the previously-described optoelectronic devices comprising light-emitting sources and photoluminescent blocks.

Another object of an embodiment is to increase the luminous efficacy of the optoelectronic device.

Another object of an embodiment is to increase the proportion of the first radiation converted by the photoluminescent block.

Another object of an embodiment is to decrease the re-absorption of the second radiation in the photoluminescent block.

Another object of an embodiment is to decrease the dimensions of the photoluminescent blocks.

Another object of an embodiment is to be able to manufacture optoelectronic devices comprising light-emitting diodes at an industrial scale and at a low cost.

Thus, an embodiment provides an optoelectronic device comprising:

light-emitting sources, each light-emitting source being capable of emitting a first radiation at a first wavelength;

photoluminescent blocks distributed into first photo-luminescent blocks capable of converting by optical pumping the first radiation into a second radiation at a second wavelength and second photoluminescent blocks capable of converting by optical pumping the first radiation into a third radiation at a third wavelength; and for each photoluminescent block, an optical coupler comprising a first photonic crystal at least partially surrounding said photoluminescent block and covering, with said photoluminescent block, one of the light-emitting sources next to said photoluminescent block, the optical coupler being capable of modifying the propagation direction of rays of the first radiation emitted by said light-emitting source to redirect the rays towards said photoluminescent block.

According to an embodiment, each optical coupler comprises a first layer of a first material having a first refraction index at the first wavelength, the first layer having first and second opposite surfaces, the first or second surface covering said light-emitting source, each optical coupler further comprising first openings extending in the first layer from the first surface and/or the second surface and filled with a second material having a second refraction index at the first wavelength different from the first refraction index.

According to an embodiment, each photoluminescent block comprises a second photonic crystal capable of giving way to the first radiation, the propagation speed of the first radiation in the photoluminescent block being smaller than the propagation speed of the first radiation in the optical coupler adjacent to said photoluminescent block.

According to an embodiment, each photoluminescent block comprises nanometer-range photoluminescent single-crystal particles of a semiconductor material.

According to an embodiment, each photoluminescent block comprises a second layer of a third material having a third refraction index at the first wavelength, the second layer having third and fourth opposite surfaces, the third or fourth surface covering said light-emitting source, each photoluminescent block further comprising second openings extending in the second layer from the third and/or fourth surface and filled with a fourth material having a fourth refraction index at the first wavelength different from the third refraction index.

According to an embodiment, the photoluminescent single-crystal particles are located in the second layer and/or in the second openings.

According to an embodiment, the device further comprises, for each photoluminescent block, a first selective mirror interposed between said light source and said photoluminescent block, the first selective mirror being capable of giving way to the first radiation and of reflecting the second radiation and/or the third radiation.

According to an embodiment, the first selective mirror comprises a third photonic crystal.

According to an embodiment, the device further comprises, for each photoluminescent block, a second selective mirror, said photoluminescent block being interposed between said light source and said second mirror, the second mirror being capable of reflecting the first radiation and of giving way to the second radiation and/or the third radiation.

According to an embodiment, the device further comprises third photoluminescent blocks capable of converting by optical pumping the first radiation into a fourth radiation at a fourth wavelength.

According to an embodiment, the device further comprises walls reflecting the first, second, and third radiations, said walls separating the light-emitting sources and separating the photoluminescent blocks.

According to an embodiment, the device further comprises a filter covering the photoluminescent blocks on the side of the photoluminescent blocks opposite to the light-emitting sources and capable of blocking the first radiation and of giving way to the second and third radiations.

According to an embodiment, the light-emitting sources comprise light-emitting diodes or vertical cavity surface-emitting laser diodes.

An embodiment also provides a method of manufacturing an optoelectronic device such as previously defined, comprising the steps of:

a) forming the light-emitting sources;

b) forming the photoluminescent blocks on the light-emitting sources; and d) forming the optical couplers on the light-emitting sources, each optical coupler at least partially surrounding one of the photoluminescent blocks.

The foregoing and other features and advantages will be discussed in detail in the following non-limiting description of specific embodiments in connection with the accompanying drawings.

DETAILED DESCRIPTION

For clarity, the same elements have been designated with the same reference numerals in the various drawings and, further, as usual in the representation of electronic circuits, the various drawings are not to scale. Further, only those elements which are useful to the understanding of the present description have been shown and will be described. In particular, the means for controlling a light-emitting source of an optoelectronic device, particularly a light-emitting diode, are well known by those skilled in the art and are not described.

In the following description, unless otherwise indicated, terms "substantially", "about", "approximately", and "in the order of" mean "to within 10%". When the terms "approximately", "substantially", and "in the order of" are used in relation with angles or orientations, they designate a tolerance of plus or minus 10° of the value in question. Further, "active area" of a light-emitting diode designates the region of the light-emitting diode from which most of the electromagnetic radiation provided by the light-emitting diode is emitted.

In the following description, a radiation is said to be "at a . . . wavelength" when most of the energy of the radiation is at said wavelength to within 10%.

Further, the term "particle" such as used in the context of the present disclosure should be understood in a broad sense and corresponds not only to compact particles more or less having a spherical shape but also to angular particles, to flattened particles, to flake-shaped particles, to fiber-shaped particles, or to fibrous particles, etc. It should be understood that the "size" of particles in the context of the present disclosure means the smallest transverse dimension of the particles. Particles of a material means the particles considered individually, that is, the unit elements of the material, knowing that the material may appear in the form of particle clusters. Phrase "average size" of particles means according to the present disclosure the arithmetic average of the particle sizes, that is, the sum of the particle sizes divided by the number of particles. The grain-size distribution of the particles may be measured by laser granulometry by using, for example, a Malvern Mastersizer 2000.

Figure 1:
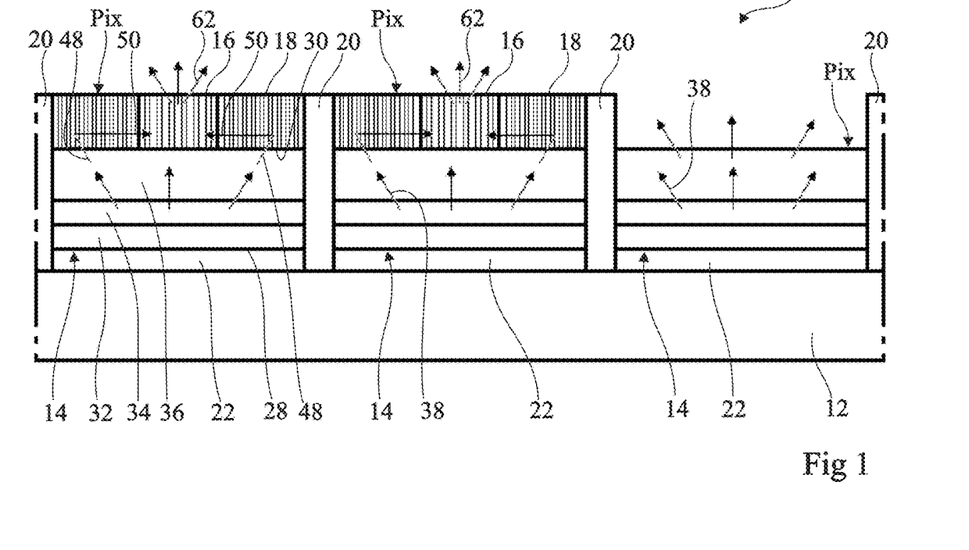
FIGS. 1 and 2 respectively are a cross-section view and a top view, partial and simplified, of an embodiment of an optoelectronic device.
Figure 2:
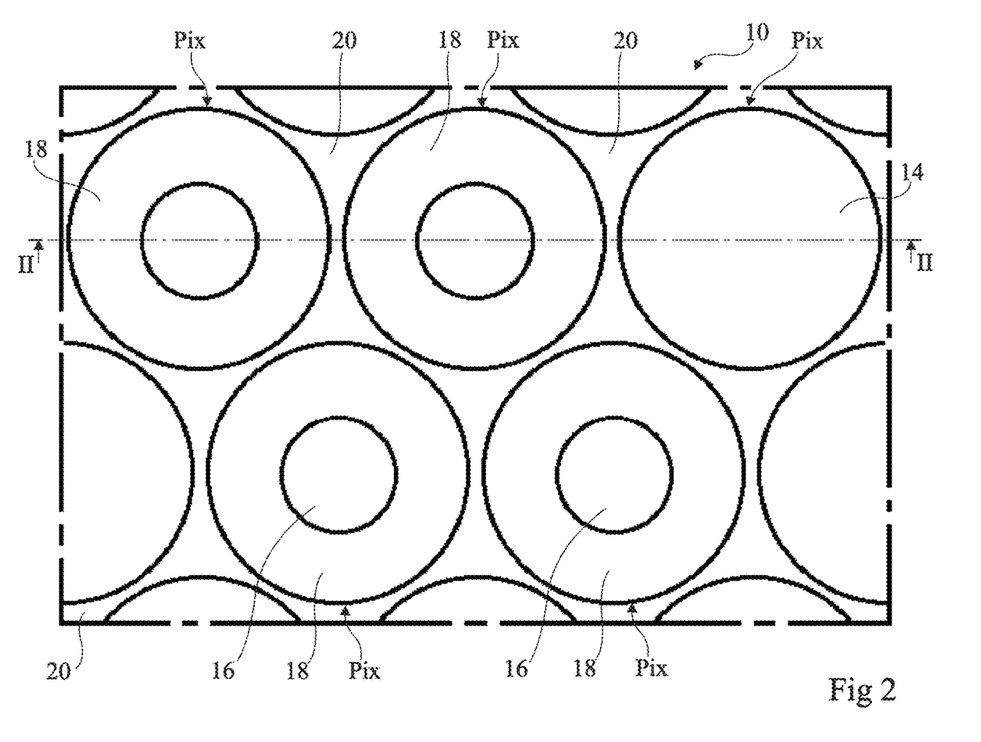

FIGS. 1 and 2 show an embodiment of an optoelectronic device 10, for example corresponding to a display screen or to an image projection device comprising display sub-pixels Pix. FIG. 1 is a cross-section view of FIG. 2 along line II-II.

Device 10 comprises a support 12 and, for each display sub-pixel Pix, a light-emitting diode 14 capable of emitting a first radiation at a first wavelength and resting on support 12. Device 10 further comprises, for at least some of display sub-pixels Pix, a photoluminescent block 16 resting on light-emitting source 14 and an optical coupler 18 resting on light-emitting source 14 and surrounding photoluminescent block 16. Each photoluminescent block 16 is capable of converting the first radiation emitted by light-emitting source 14 into a radiation at another wavelength. Each optical coupler 18 is capable of directing the first radiation towards the photoluminescent block 16 that it surrounds.

According to an embodiment, all light-emitting sources 14 emit a radiation at a first wavelength.

According to an embodiment, optoelectronic device 10 comprises at least two types of photoluminescent blocks 16. The photoluminescent blocks 16 of the first type are capable of converting the first radiation at the first wavelength into a second radiation at a second wavelength by optical pumping. The photoluminescent blocks 16 of the second type are capable of converting the first radiation at the first wavelength into a third radiation at a third wavelength by optical pumping. According to an embodiment, optoelectronic device 10 comprises at least three types of photoluminescent blocks 16, the photoluminescent blocks 16 of the third type being capable of converting the first radiation at the first wavelength into a fourth radiation at a fourth wavelength by optical pumping.

According to an embodiment, the first wavelength corresponds to an ultraviolet radiation, and is within the range from 350 nm to 430 nm. According to an embodiment, the second wavelength corresponds to green light and is within the range from 510 nm to 570 nm. According to an embodiment, the third wavelength corresponds to red light and is within the range from 600 nm to 720 nm. According to an embodiment, the fourth wavelength corresponds to blue light and is within the range from 440 nm to 490 nm. For each pixel of the image to be displayed, optoelectronic device 10 then comprises at least one display sub-pixel Pix with a photoluminescent block 16 of the first type, one display sub-pixel Pix with a photoluminescent block 16 of the second type, and one display sub-pixel Pix of the third type.

According to an embodiment, optoelectronic device 10 comprises photoluminescent blocks 16 of a fourth type. The photoluminescent blocks 16 of the fourth type are capable of converting the first radiation at the first wavelength into a fifth radiation at a fifth wavelength by optical pumping. According to an embodiment, the fifth wavelength corresponds to yellow light and is within the range from 570 nm to 600 nm. According to an embodiment, the first, second, third, fourth, and fifth wavelengths are different. For each pixel of the image to be displayed, optoelectronic device 10 comprises sub-pixels with photoluminescent blocks 16 of the four types.

According to an embodiment, the first wavelength corresponds to blue light and is within the range from 440 nm to 490 nm. In this embodiment, as shown in FIGS. 1 and 2, for each pixel of the image to be displayed, optoelectronic circuit 12 comprises one display sub-pixel Pix with a photoluminescent block 16 of the first type, one display sub-pixel Pix with a photoluminescent block 16 of the second type, and one display sub-pixel with no photoluminescent block.

Device 10 may further comprise reflective walls 20 which extend between light-emitting sources 14 and photo-luminescent blocks 16 and which form a grid delimiting display sub-pixels Pix. Walls 20 decrease the crosstalk between adjacent sub-pixels Pix. Device 10 may further comprise, for each display sub-pixel Pix, a mirror 22 capable of reflecting the first radiation and arranged between support 12 and light-emitting source 14.

Device 10 may further comprise a filter, not shown, covering the photoluminescent blocks and capable of blocking the first radiation and of giving way to the second and third radiations. The filter may have a multilayer structure. According to an embodiment, for light-emitting sources 14 emitting a radiation at the first wavelength in the range from 350 nm to 430 nm, the filter may be a bandpass filter only giving way to wavelengths in the range from 440 nm to 720 nm.

Device 10 further comprises connection elements, not shown, enabling to control light-emitting sources 14.

Support 12 may comprise electronic components, not shown, particularly transistors, used for the control of light-emitting sources 14. As a variation, support 12 may be absent and optoelectronic device 10 may be connected to an electronic circuit for controlling light-emitting sources 14.

According to an embodiment, light-emitting sources 14 correspond to light-emitting diodes.

According to an embodiment, each light-emitting diode 14 may correspond to a so-called two-dimensional light-emitting diode comprising a stack of substantially planar semiconductor layers including the active area.

As an example, in FIG. 1, each light-emitting diode 14 comprises a stack of semiconductor layers having two opposite surfaces 28, 30. The stack comprises, from bottom to top in FIG. 1:

a doped semiconductor layer 32 of a first conductivity type, for example, P-type doped and delimiting surface 28;

an active area 34; and a doped semiconductor layer 36 of a second conductivity type, for example, N-type doped, delimiting surface 30.

In this embodiment, in operation, for at least some of sub-pixels Pix, voltages are applied between semiconductor layers 32 and 36 so that active area 34 of light-emitting source 14 of sub-pixel Pix emits the first radiation (arrows 38 in FIG. 1) with an intensity which depends on the voltage applied between semiconductor layers 32 and 36.

According to an embodiment, each light-emitting diode 14 may comprise at least one so-called three-dimensional light-emitting diode comprising a semiconductor shell covering a three-dimensional semiconductor element, particularly a microwire, a nanowire, a cone, a frustum, a pyramid, or a truncated pyramid, the shell being formed of a stack of non-planar semiconductor layers including the active area.

According to another embodiment, the light-emitting sources 14 correspond to vertical cavity surface-emitting laser diodes or VCSEL diodes.

According to an embodiment, the light-emitting sources 14 are arranged in a hexagonal checkerboard pattern. In the present embodiment, light-emitting sources 14 and photolumi-nescent blocks 16 have, in the top view of FIG. 2, a circular shape. However, the shape of light-emitting sources 14 and of photoluminescent blocks 16 may be different, for example, square, rectangular, or hexagonal.

According to an embodiment, each optical coupler 18 corresponds to a photonic crystal capable of directing the light rays of the first radiation that it receives towards the photo-luminescent block 16 that it surrounds.

Figure 3:
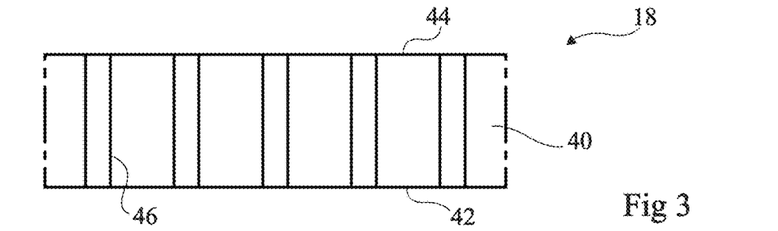
FIGS. 3 and 4 respectively are a cross-section view and a top view, partial and simplified, of an embodiment of an optical coupler of the optoelectronic device shown in FIG. 1.
Figure 4:
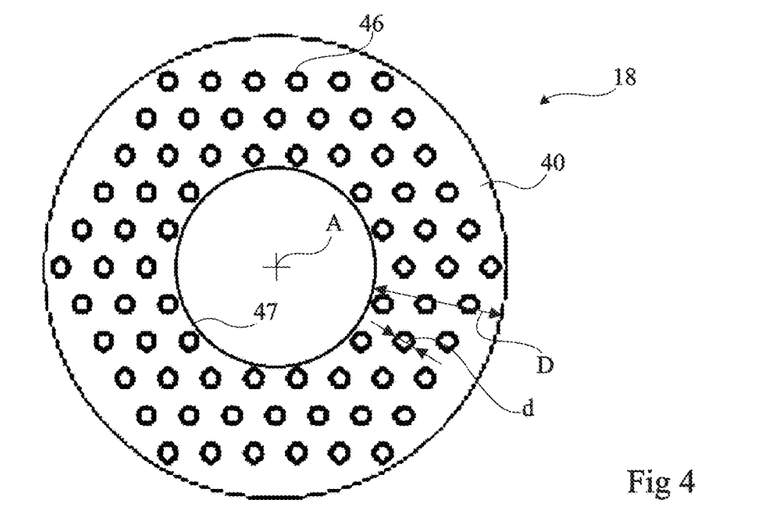

FIGS. 3 and 4 respectively are a partial cross-section view and a top view of an embodiment of optical coupler 18.

In the present embodiment, optical coupler 18 comprises a layer 40 of a first material having a first refraction index at the first wavelength. Layer 40 has two planar and parallel surfaces 42, 44, surface 42 being located on the side of light-emitting source 14 and being for example, in contact with surface 30. Openings 46 extend in layer 40 from surface 44 to surface 42. In the present embodiment, openings 46 extend across the entire thickness of layer 40. As a variation, openings 46 may extend only across a portion of the thickness of layer 40 from surface 44 or from surface 42. Each opening 46 for example extends along an axis which is substantially orthogonal to surfaces 42 and 44. Each opening 46 is filled with a second material, which may be air, having a second refraction index at the first wavelength smaller than the first refraction index. Preferably, the difference between the first refraction index and the second refraction index is as large as possible. Optical coupler 18 is crossed by a hole 47 of axis A having the photoluminescent block 16 of the sub-pixel arranged therein. Call D the dimension of optical coupler 18 measured radially and d the dimension of an opening 46 measured radially.

Openings 46 are arranged in layer 40 in a periodic or pseudo-periodic array. The cross-sections, in a plane parallel to surfaces 42, 44, of openings 46 may be identical or depend on the considered opening 46. As illustrated in FIG. 1, the shape and the layout of openings 46 are selected so that the rays 48 of the first radiation which penetrate into optical coupler 18 are redirected towards photoluminescent block 16 surrounded with optical coupler 18. Preferably, the rays 50 of the first radiation which come out of optical coupler 18 are substantially parallel to surfaces 42, 44 of optical coupler 18 and directed towards axis A.

According to an embodiment, openings 46 may be substantially aligned along radial directions with respect to axis A.

In FIG. 4, openings 46 have, in top view, a circular cross-section. However, the cross-section of openings 46 may be different, for example, square, rectangular, or hexagonal. As a variation, openings 46 may correspond to rings surrounding central hole 47, for example, concentric rings of axis A.

The first material may be transparent in the visible range. The first material may be an oxide, a nitride, or an organic material. According to an embodiment, the first material is selected from the group comprising titanium oxide ($TiO_2$), aluminum oxide ($Al_2O_3$), silicon nitride (SiN), silicon oxynitride ($SiO_yN_x$), silicon oxide ($SiO_2$), zirconium oxide ($ZrO_2$), hafnium oxide ($HfO_2$), lutetium oxide ($Lu_2O_3$), magnesium oxide (MgO), yttrium oxide ($Y_2O_3$), zinc oxide (ZnO), poly(methyl methacrylate) (PMMA), silicones, resists, and alloys or mixtures of at least two of these compounds. Layer 40 is at least partly transparent to the first radiation. The refraction index of the first material at the first wavelength is in the range from 1.4 to 4.

The second material is selected from the group comprising air, oxides having a refraction index at the first wavelength smaller than 1.5 transparent in the visible range, particularly silicon oxide ($SiO_2$), or organic materials transparent in the visible range, such as PMMA or silicones. The refraction index of the second material at the first wavelength is in the range from 1 to 1.5.

The height of layer 40, measured along a direction perpendicular to surface 28, is in the range from 100 nm to 500 nm and preferably from 150 nm to 350 nm. In top view, the coupler is inscribed within a circle having a diameter in the range from 3 μm to 50 μm. The pitch between the centers of two adjacent openings 46 is in the range from 150 nm to 250 nm. The ratio of dimension d to the pitch between the centers of two adjacent openings 46, also called fill factor of openings 46, is in the range from 10% to 90%.

According to an embodiment, when the first wavelength is equal to 450 nm, optical coupler 18 may comprise a layer 40 made of $TiO_2$ having a refraction index at the 450-nm wavelength equal to 3.14 and openings 46 may be filled with air having a refraction index at the 450-nm wavelength equal to 1. The pitch between two adjacent openings 46 may be in the order of 203 nm and dimension d is in the order of 101 nm. For a succession of twenty openings 46 substantially radially aligned, dimension D of optical coupler 18 is in the order of 4 μm.

According to an embodiment, each photoluminescent block 16 comprises phosphors dispersed in a matrix. The phosphors may be nanometer-range single-crystal particles of a semiconductor material, also called semiconductor nanocrystals hereafter. The phosphors may be organic phosphors. According to another embodiment, each photoluminescent block 16 comprises a stack of semiconductor layers forming multiple quantum wells.

According to an embodiment, each photoluminescent block 16 further corresponds to a photonic crystal capable of slowing down the light rays of the first radiation that it receives from the optical coupler 18 which surrounds it, without however slowing down the radiation supplied by photoluminescent block 16 after conversion by optical pumping.

Figure 5:
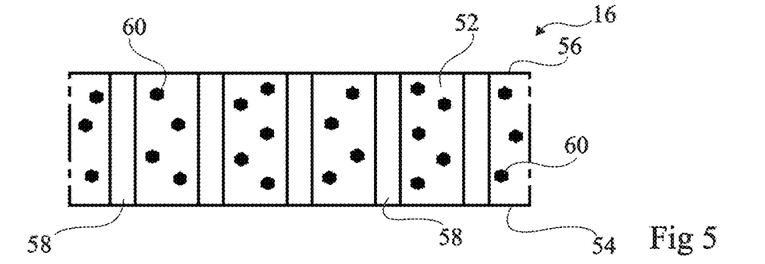
FIGS. 5 and 6 respectively are a cross-section view and a top view, partial and simplified, of an embodiment of a photoluminescent block of the optoelectronic device shown in FIG. 1.
Figure 6:
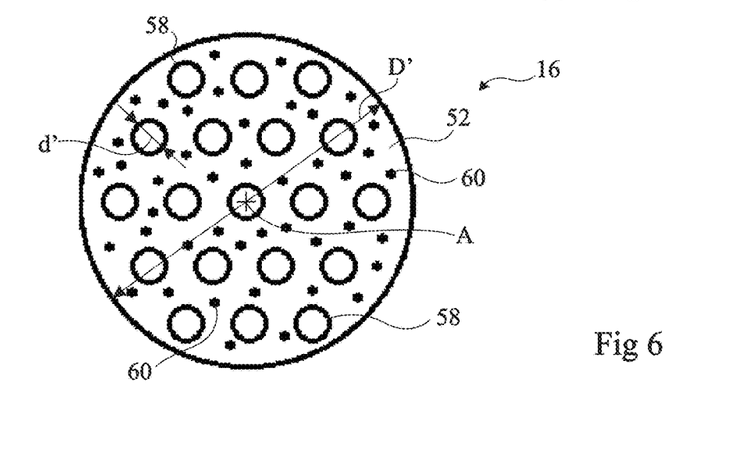

FIGS. 5 and 6 respectively are a partial cross-section view and a top view of an embodiment of photoluminescent block 16.

According to the present embodiment, each photo-luminescent block 16 comprises a layer 52 of a third material having a third refraction index at the first wavelength. Layer 52 has two planar and parallel surfaces 54, 56, surface 54 being located on the side of light-emitting diode 14 and for example being in contact with surface 30. Openings 58 extend in layer 52 from surface 56. In the present embodiment, openings 58 extend across the entire thickness of layer 52. Each openings 58 for example extends along an axis which is substantially orthogonal to surfaces 54 and 56. Each opening 58 is filled with a fourth material having a fourth refraction index at the first wavelength smaller than the third refraction index. The fourth material may be identical to the second material. Call D' the dimension of photoluminescent block 16 measured radially and d' the dimension of opening 58 measured radially.

Photoluminescent block 16 further comprises phosphors 60 capable of converting the first radiation into another radiation. In the present embodiment, phosphors 60 are located in layer 52.

Openings 58 are arranged in layer 52 in a periodic or pseudo-periodic array. The cross-sections, in a plane parallel to surfaces 54, 56, of openings 58 may be identical or depend on the considered opening 58. The shape and the layout of openings 58 are selected so that the rays 50 of the first radiation which penetrate into photoluminescent block 16 continue their travel through photoluminescent block 16 without generally changing their propagation direction, but with an average propagation speed which is decreased with respect to the average propagation speed of the rays of the first radiation in light source 14 or in optical coupler 18. According to an embodiment, openings 58 may be substantially aligned along radial directions with respect to axis A.

According to an embodiment, each photoluminescent block 16 has the structure of a photonic crystal mirror, particularly of a Bragg mirror. The characteristics of the photonic crystal mirror are defined so that the lower limit of the bandgap of the photonic crystal mirror is substantially equal to the first wavelength or so that the upper limit of the bandgap of the photonic crystal mirror is substantially equal to the first wavelength. Thereby, the first radiation propagates in photoluminescent block 16 substantially with no reflection but with a decreased average propagation speed. The duration of the travel of the first radiation in photoluminescent block 16 being increased, the absorption of the first radiation by phosphors 60 for a conversion into a radiation at another wavelength is increased by at least a factor 1.5 with respect to a photo-luminescent block where openings 58 would not be present. The radiation emitted by photoluminescent block 16 after conversion of the first radiation by optical pumping is at a wavelength much greater than the wavelengths of the bandgap of the photonic crystal mirror so that this radiation substantially freely propagates in photoluminescent block 16. Given that this radiation is emitted in all directions, it escapes from photoluminescent block 16 as shown by arrows 62 in FIG. 1. Preferably, the average propagation speed of the radiation emitted by photoluminescent block 16 by optical pumping is greater than the average propagation speed of the first radiation in photoluminescent block 16.

In FIG. 6, openings 58 have a circular cross-section in top view. However, the cross-section of openings 58 may be different, for example, square, rectangular, or hexagonal. As a variation, openings 58 may correspond to rings, for example, concentric rings of axis A.

The third material is selected from the group comprising a polymer, particularly PMMA, silicones, and resists. Layer 52 is at least partly transparent to the first radiation. The refraction index of the third material at the first wavelength is in the range from 1.4 to 4.

The fourth material is for example air.

The height of layer 52, measured along a direction perpendicular to surface 28, is in the range from 100 nm to 500 nm. According to an embodiment, the height of layer 52 is substantially equal to the height of layer 40. In top view, photoluminescent block 16 is inscribed within a circle having its diameter D' in the range from 3 μm to 40 μm. According to an embodiment, the ratio of the pitch, in top view, between the centers of two adjacent openings 58, to the first wavelength is approximately equal to 0.355. The pitch between two adjacent openings 58 is in the range from 124 nm (for a first 350-nm wavelength) and 163 nm (for a first 460-nm wavelength). The dimension d' of each opening 58 is selected so that the ratio between dimension d' and the pitch between the centers of two adjacent openings 58, also called fill factor of openings 58, is in the range from 10% to 90%.

Figure 7:
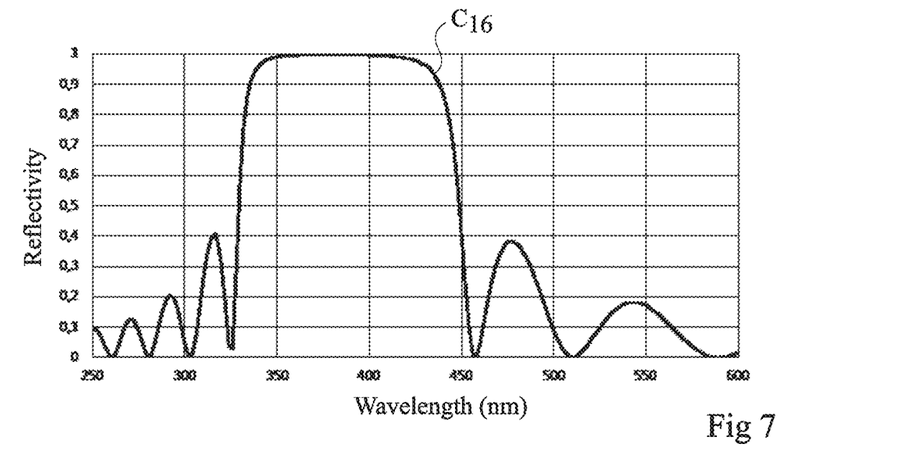
FIG. 7 shows a curve of the variation of the reflectivity according to the wavelength of an embodiment of a photoluminescent block.

FIG. 7 shows a curve $C_{16}$ of the variation of the reflectivity according to the wavelength of an embodiment of photoluminescent block 16 for which openings 58 have a dimension in the order of 60 nm and are filled with air and for which layer 52 is made of silicone with phosphors 60 of quantum dot type, having a dimension in the order of 60 nm. The refraction index at the 450-nm wavelength of the assembly formed by layer 52 and phosphors 60 is equal to approximately 1.56. The pitch between two adjacent openings 58 is in the order of 160 nm and the dimension is in the order of 100 nm. This provides a photonic crystal mirror having the lower limit of its bandgap approximately equal to 450 nm.

Figure 8:
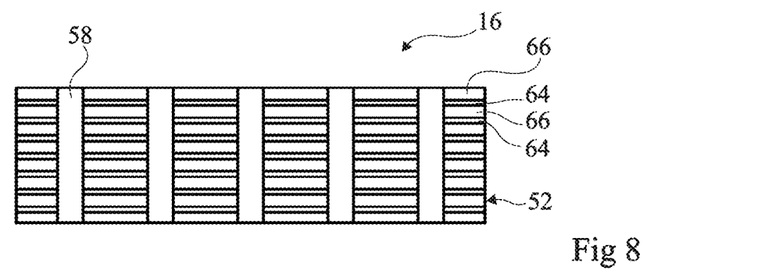
FIGS. 8 to 11 are partial simplified cross-section views of other embodiments of the photoluminescent block of the optoelectronic device shown in FIG. 1.

FIG. 8 is an enlarged cross-section view of another embodiment of photoluminescent block 16 where photoluminescent block 16 comprises multiple quantum wells. Layer 52 then corresponds to a stack of semiconductor layers forming an alternation of quantum wells 64 and of barrier layers 66 and openings 58 cross the semiconductor layers of the stack substantially along the stacking direction. The layer of the stack of layers closest to semiconductor layer 36 may play the role of an etch stop layer on forming of openings 58. Barrier layers 66 and quantum wells 64 are made of different materials which may correspond to AlInGaN-type alloys where the proportions of indium and of aluminum, possibly zero, are different. Since layer 52 is made of at least two different materials, the optical properties of the third previously-described material, which are used to determine the optical properties of photoluminescent block 16, are then defined from the optical properties of the material forming barrier layers 66 and of the material forming the quantum well layers 64. As an example, it can be considered that the optical refraction index of the third material is equal to the average of the optical refraction indexes of the materials forming quantum well layers 64 and barrier layers 66 weighted by the thicknesses of these layers. The fourth material may be an oxide ($SiO_2$), a silicon carbide having a refraction index smaller than that of the third material, air, or a polymer.

Figure 9:
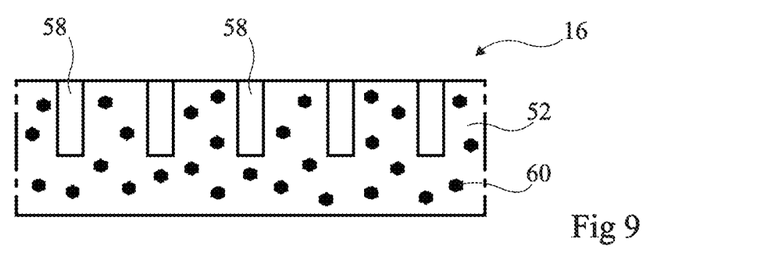

FIG. 9 is an enlarged cross-section view of another embodiment of photoluminescent block 16 where openings 58 extend only across portion of the thickness of layer 52. In the case where photoluminescent block 16 comprises multiple quantum wells, the etching of openings 58 may selectively stop on a stop layer provided in the layer stack, which provides openings 58 at the desired depth.

Figure 10:
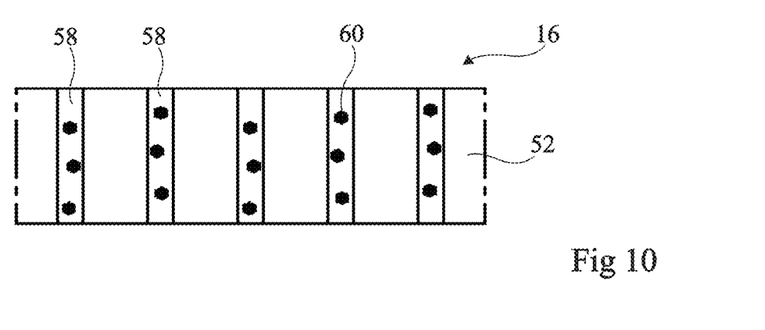

FIG. 10 is an enlarged cross-section view of another embodiment of photoluminescent block 16 where phosphors 60 are only located in openings 58.

Figure 11:
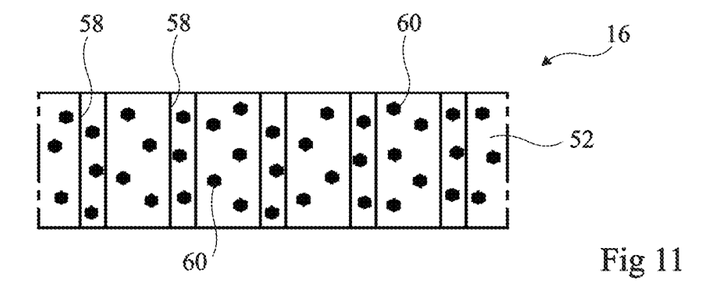

FIG. 11 is an enlarged cross-section view of another embodiment of photoluminescent block 16 where phosphors 60 are located both in layer 52 and in openings 58.

According to an embodiment, the semiconductor layers forming light source 14 are at least partly made of a semiconductor material. The semiconductor material may be silicon, germanium, silicon carbide, a III-V compound, a II-VI compound, or a combination of at least two of these compounds.

The semiconductor layers forming light source 14 may be at least partly made of semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

The semiconductor layers forming light source 14 may be at least partly made of semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Active area 34 is the layer from which most of the radiation provided by light-emitting source 14 is emitted. Active area 34 may comprise confinement means. Active area 34 may comprise a single quantum well. It may then comprise a semiconductor material different from the semiconductor material forming semiconductor layers 32 and 36 and having a bandgap smaller than that of semiconductor layers 32 and 36. Active area 34 may comprise multiple quantum wells. It then comprises a stack of semiconductor layers forming an alternation of quantum wells and of barrier layers. It is for example formed of an alternation of GaN and InGaN layers having respective thicknesses from 3 nm to 20 nm (for example, 6 nm) and from 1 nm to 30 nm (for example, 2.5 nm). The GaN layers may be doped, for example, of type N or P. According to another example, active area 34 may comprise a single InGaN layer, for example having a thickness greater than 10 nm.

The height of walls 20, measured along a direction perpendicular to surface 28, is in the range from 500 nm to 100 μm, preferably from 5 μm to 30 μm. The minimum thickness of walls 20, measured along a direction parallel to surface 28, is in the range from 20 nm to 50 µm, preferably from 50 nm to 10 µm. In the view of FIG. 2, the area of each light-emitting source 14 corresponds to the area of a circle having a radius in the range from 1 µm to 100 µm, preferably from 3 µm to 15 µm.

According to an embodiment, walls 20 are electrically insulated from active layers 34. According to an embodiment, walls 20 may be formed of a reflective material or covered with a coating reflecting the radiation emitted by photoluminescent blocks 16 and/or light-emitting sources 14. As an example, walls 20 may comprise a metal core, particularly made of aluminum (Al), of copper (Cu), or of silver (Ag), covered with an electrically insulating layer, for example, an oxide.

According to an embodiment, phosphors 60 are nanometer-range monocrystalline particles of a semiconductor material, also called semiconductor nanocrystals hereafter. The internal quantum efficiency $QY_{int}$ of a photoluminescent material is equal to the ratio of the number of emitted photons to the number of photons absorbed by the photoluminescent substance. Internal quantum efficiency $QY_{int}$ of the semiconductor nanocrystals is greater than 5%, preferably greater than 10%, more preferably greater than 20%.

According to an embodiment, the average size of the nanocrystals is in the range from 0.5 nm to 1,000 nm, preferably from 0.5 nm to 500 nm, more preferably from 1 nm to 100 nm, particularly from 2 nm to 30 nm. For dimensions smaller than 50 nm, the photoconversion properties of semiconductor nanocrystals essentially depend on quantum confinement phenomena. The semiconductor nanocrystals then correspond to quantum dots.

According to an embodiment, the semiconductor material of the semiconductor crystals is selected from the group comprising cadmium selenide (CdSe), indium phosphide (InP), cadmium sulfide (CdS), zinc sulfide (ZnS), zinc selenide (ZnSe), cadmium telluride (CdTe), zinc telluride (ZnTe), cadmium oxide (CdO), zinc cadmium oxide (ZnCdO), cadmium zinc sulfide (CdZnS), cadmium zinc selenide (CdZnSe), silver indium sulfide ($AgInS_2$), alloys based on aluminum, indium, and gallium (AlInGa), and a mixture of at least two of these compounds. According to an embodiment, the semiconductor material of the semiconductor nanocrystals is selected from the materials mentioned in Le Blevenec et al.'s publication in Physica Status Solidi (RRL)—Rapid Research Letters Volume 8, No. 4, pages 349-352, April 2014.

According to an embodiment, the dimensions of the semiconductor nanocrystals are selected according to the desired wavelength of the radiation emitted by the semiconductor nanocrystals. As an example, CdSe nanocrystals having an average size in the order of 3.6 nm are capable of converting blue light into red light and CdSe nanocrystals having an average size in the order of 1.3 nm are capable of converting blue light into green light. According to another embodiment, the composition of the semiconductor nanocrystals is selected according to the desired wavelength of the radiation emitted by the semiconductor nanocrystals.

According to an embodiment, each photoluminescent block 16 contains from 2 wt. % to 90 wt. %, preferably from 10 wt. % to 60 wt. %, of nanocrystals, for example, approximately 20 wt. % of nanocrystals.

Figure 12:
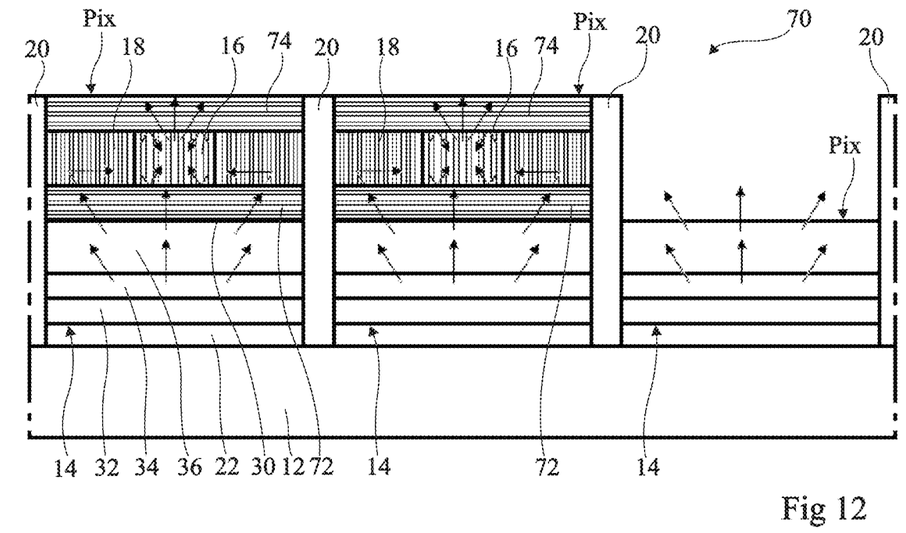
FIG. 12 is a partial simplified cross-section view of another embodiment of an optoelectronic device.

FIG. 12 is a partial simplified cross-section view of an embodiment of an optoelectronic device 70. Optoelectronic device 70 comprises the same elements as optoelectronic device 10 shown in FIG. 1, and further comprises, for each display sub-pixel Pix, a selective mirror 72 interposed between the light-emitting source 14 and photoluminescent block 16 and a selective mirror 74 covering photoluminescent block 16 on the side of photoluminescent block 16 opposite to light-emitting source 14.

Selective mirror 72 is capable of giving way to the first radiation and of reflecting the radiation emitted by photoluminescent block 16. Selective mirror 72 advantageously enables to avoid for the radiation supplied by photoluminescent block 16 to escape from photoluminescent block 16 on the side of light-emitting source 14.

Selective mirror 74 is capable of giving way to the radiation emitted by photoluminescent block 16 and of reflecting the first radiation. Selective mirror 74 advantageously enables to avoid for the first radiation to escape from photoluminescent block 16 towards the observer. Further, by reflecting the first radiation in photoluminescent block 16, mirror 74 enables to increase the distance traveled by the first radiation in photoluminescent block 16 and thus to increase the proportion of the first radiation which is converted by photoluminescent block 16.

According to an embodiment, each mirror 72, 74 corresponds to a photonic crystal, for example, to a Bragg mirror.

Figure 13:
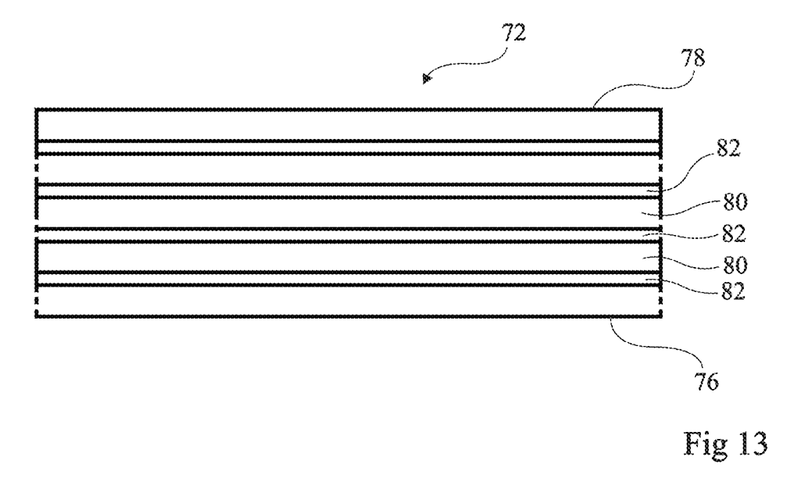
FIG. 13 is a partial simplified cross-section view of an embodiment of a reflective mirror of the optoelectronic device shown in FIG. 12.

FIG. 13 shows an embodiment of selective mirror 72 in the case where mirror 72 has the structure of a Bragg mirror. Selective mirror 72 comprises two surfaces 76 and 78, surface 76 resting on surface 30 of light-emitting source 14, preferably in contact with light-emitting source 14, optical coupler 18 and photoluminescent block 16 resting on surface 78, preferably in contact with surface 78. Mirror 72 comprises an alternation of first and second dielectric layers 80, 82, substantially planar and parallel to surface 76. The first dielectric layers 80 are made of a fifth material having a fifth refraction index at the wavelength of the radiation emitted by photoluminescent block 16 and the second dielectric layers 82 are made of a sixth material having a sixth refraction index at the wavelength of the radiation emitted by photoluminescent block 16 smaller than the fifth refraction index.

The fifth material may be an oxide, a nitride, or an organic material. According to an embodiment, the fifth material is selected from the group comprising titanium oxide ($TiO_2$), aluminum oxide ($Al_2O_3$), silicon nitride (SiN), silicon oxynitride ($SiO_yN_x$), silicon oxide ($SiO_2$), zirconium oxide ($ZrO_2$), hafnium oxide ($HfO_2$), lutetium oxide ($Lu_2O_3$), magnesium oxide (MgO), yttrium oxide ($Y_2O_3$), zinc oxide (ZnO), polymethyl methacrylate (PMMA), silicones, resists, and alloys or mixtures of at least two of these compounds. The refraction index of the fifth material at the wavelength of the radiation emitted by photoluminescent block 16 is in the range from 1.4 to 4.

The sixth material is selected from the group comprising air, oxides having a refraction index at the first wavelength smaller than 1.5 transparent in the visible range, particularly silicon oxide ($SiO_2$), or organic materials transparent in the visible range, such as PMMA or silicones. The refraction index of the sixth material at the wavelength of the radiation emitted by photoluminescent block 16 is in the range from 1 to 1.5.

The structure of selective mirror 72 may be identical for all display sub-pixels Pix.

Mirror 74 may have the same structure as mirror 72, the thicknesses of layers 80 and 82 of mirror 74 being selected to give way to the radiation emitted by photoluminescent block 16 and to reflect the first radiation.

The structure of selective mirror 74 may be identical for all display sub-pixels Pix.

Figure 14:
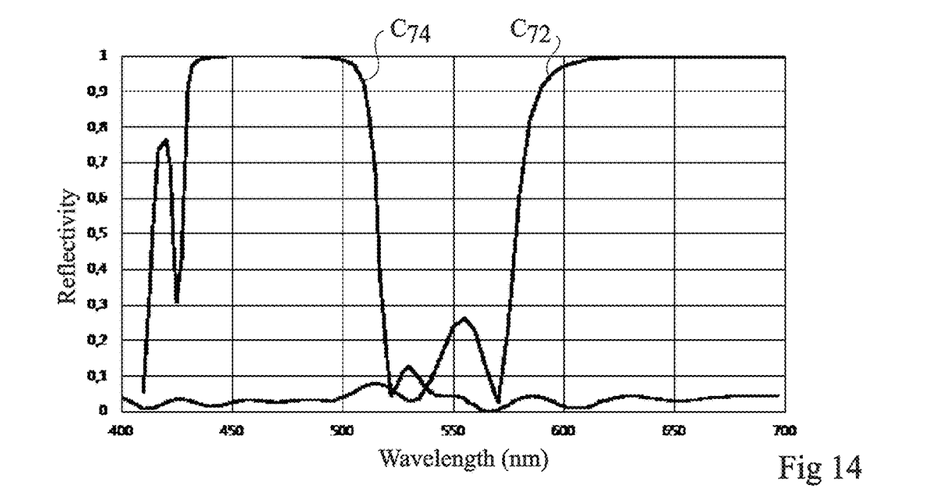
FIG. 14 shows a curve of the variation of the reflectivity according to the wavelength of an embodiment of the mirror of FIG. 13.

FIG. 14 shows curves $C_{72}$ and $C_{74}$ of variation of the reflectivity according to the wavelength respectively in the case where mirror 72 comprises, sandwiched between silicon oxide layers 57 of nm, a stack comprising the repetition, at least six times, of a pattern comprising a titanium oxide layer of 74 nm and a silicon oxide layer of 115 nm and in the case where mirror 74 comprises, sandwiched between titanium oxide layers of 15 nm, a stack comprising the repetition, at least twelve times, of a pattern comprising a titanium oxide layer of 31 nm and a silicon oxide layer of 64 nm.

Mirror 72 is substantially transparent for a first radiation at the 450-nm wavelength and reflects the radiation emitted by photoluminescent block 16 for wavelengths in the range from 570 nm to 700 nm. Mirror 74 is substantially transparent for the radiation emitted by photoluminescent block 16 at wavelengths in the range from 520 nm to 700 nm and reflects the first radiation at the 450-nm wavelength.

Figure 15:
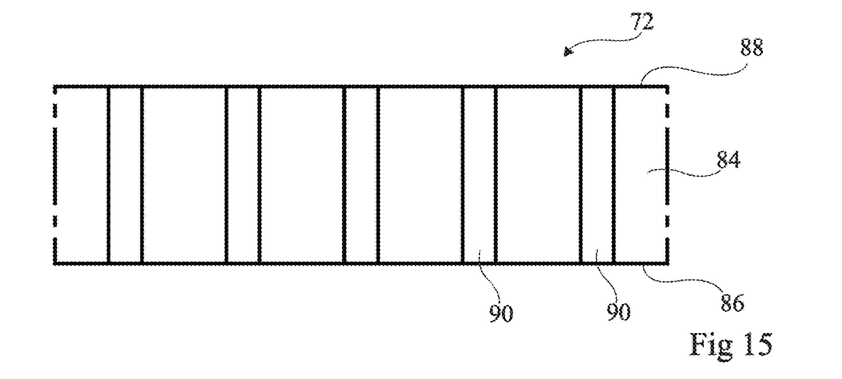
FIG. 15 is a partial simplified cross-section view of another embodiment of a reflective mirror of the optoelectronic device shown in FIG. 12.

FIG. 15 is an enlarged cross-section view of another embodiment of mirror 72, where the mirror has a structure similar to that shown in FIG. 3.

According to an embodiment, mirror 72 comprises a layer 84 having two parallel opposite surfaces 86, 88, made of the fifth material. Openings 90 extend in layer 84 from surface 88. In the present embodiment, openings 90 extend across the entire thickness of layer 84. Each opening 90 is filled with the sixth material, which as compared with the previous list may further correspond to air. The dimensions and the distribution of openings 90 are selected so that mirror 72 gives way to the first radiation and reflects the radiation emitted by photoluminescent block 16. Mirror 74 may also have the structure shown in FIG. 15, the dimensions and the distribution of openings 90 are selected so that mirror 72 gives way to the radiation emitted by photoluminescent block 16 and reflects the first radiation.

An embodiment of a method of manufacturing optoelectronic device 10 shown in FIG. 1 may comprise the steps of:

1) Forming over an entire surface of support 12 the stack of semiconductor layers forming light-emitting sources 14.

The semiconductor layers forming light-emitting sources 14 may be formed by a method such as chemical vapor deposition (CVD) or metal-organic chemical vapor deposition (MOCVD), also known as metal-organic vapor phase epitaxy (MOVPE). However, methods such as molecular beam epitaxy (MBE), gas source MBE (GSMBE), metal-organic MBE (MOMBE), plasma-assisted MBE (PAMBE), atomic layer epitaxy (ALE), or hydride vapor phase epitaxy (HVPE) may be used, as well as atomic layer deposition (ALD) or physical vapor deposition (PVD). Further, methods such as evaporation or cathode sputtering may be used.

Step 1) may further comprise the forming of elements of connection of light-emitting source 14 for each display sub-pixel Pix.

2) Forming photonic crystals 18 and photoluminescent blocks 16.

Photoluminescent blocks 16 may be formed by the deposition on the structure obtained at step 1) of a colloidal dispersion of semiconductor nanocrystals in a bonding matrix, for example, by a so-called additive method. The so-called additive method may comprise the direct printing of the colloidal dispersion at the desired locations, for example, by inkjet printing, photogravure, silk-screening, flexography, spray coating, aerosol coating, or drop casting. The layer 52 of each photoluminescent block 16 is thus obtained. Openings 58 can then be etched in each layer 52, for example, by photolithography techniques. As a variation, the colloidal dispersion comprising the semiconductor nanocrystals dispersed in the bonding matrix may be deposited over the entire structure obtained at step 1), photoluminescent blocks 16 being then defined by photolithography techniques.

The layer 40 of each optical coupler 18 may be formed by a so-called additive method on the structure obtained at step 1) at the locations which are not occupied by photoluminescent blocks 16. Openings 46 can then be etched in each layer 40, for example, by photolithography techniques.

3) Forming walls 20 delimiting light source 14 and optical coupler 18 for each display pixel Pix. This can be obtained by etching openings throughout the entire thickness of the structures formed on support 12 at steps 1) and 2) at the desired locations of walls 20. The implemented etching may be a dry etching, for example, using a plasma based on chlorine and on fluorine, or an etching with an inductively coupled plasma (ICP), a reactive ion etching (RIE), a dry etching, or a combination of said processes. The openings are then filled with the material forming walls 20. Walls 20 may have a multilayer structure, the openings being then filled by successive depositions.

In the case where photoluminescent blocks 16 have the structure shown in FIG. 8, step 2) may comprise the steps of:

2a) growing by epitaxy on a first substrate the stack of semiconductor layers forming the multiple quantum wells of the photoluminescent blocks of the first type all over the first substrate;

2b) etching the stack to delimit the photo-luminescent blocks of the first type;

2c) depositing a selective growth mask on the photoluminescent blocks of the first type;

2d) growing by epitaxy the stack of semiconductor layers forming the multiple quantum wells of the photoluminescent blocks of the second type between the photoluminescent blocks of the first type;

2e) forming openings 58 in the photo-luminescent blocks of the first type and of the second type;

2f) bonding, for example by molecular bonding or by using a bonding material, for example, a polymer, the structure obtained at step 2e), on the side of photoluminescent blocks 16, the photoluminescent blocks of the first type and of the second type being aligned with the desired display sub-pixels; and 2g) removing the first substrate.

An embodiment of a method of manufacturing optoelectronic device 70 shown in FIG. 12 may comprise previously-described steps 1), 2), and 3) and comprise, between steps 1) and 2), a step of forming the structure of selective mirror 72 over the entire structure obtained at step 1) and, between steps 2) and 3), a step of forming the structure of selective mirror 74 over the entire structure obtained at step 2), the forming of walls 20 delimiting mirror 72 and mirror 74 for each display pixel Pix.

Figure 16:
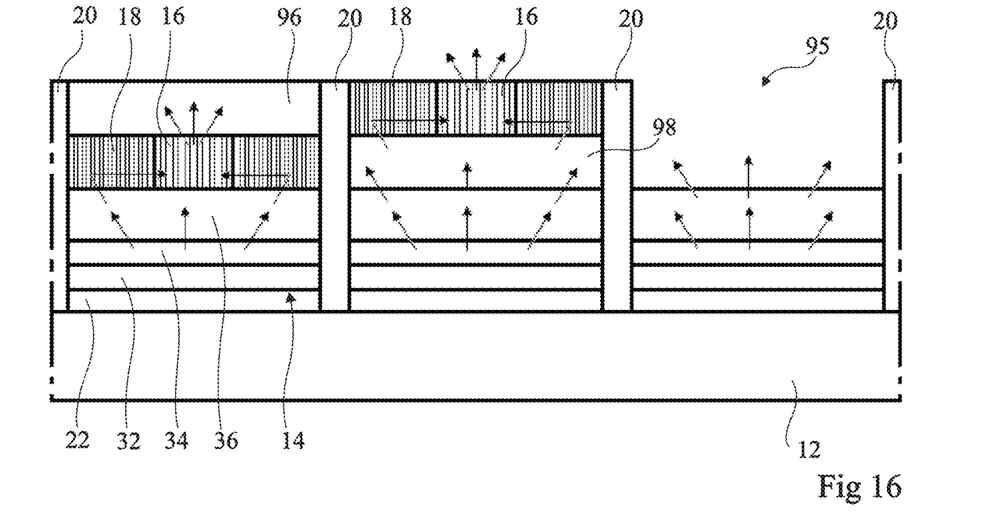
FIG. 16 is a partial simplified cross-section view of another embodiment of an optoelectronic device.

FIG. 16 is a partial simplified cross-section view of another embodiment of an optoelectronic device 95. Optoelectronic device 95 comprises the same elements as optoelectronic device 10 shown in FIG. 1, with the difference that optoelectronic device 95 further comprises, for each photoluminescent block of the first type, a layer 96 substantially transparent to the second radiation, for example, substantially transparent in the visible range, covering photoluminescent block 16 and the optical coupler 18 which surrounds it, and with the difference that optoelectronic device 90 further comprises, for each photoluminescent block of the second type, a layer 98 substantially transparent to the first radiation, for example, substantially transparent in the visible and ultraviolet range, interposed between, on the one hand, layer 36 and, on the other hand, second photoluminescent block 16 and the surrounding optical coupler 18.

In the case where each photoluminescent block 16 comprises multiple quantum wells, an embodiment of a method of manufacturing optoelectronic device 95 may comprise previously-described steps 1), 2), and 3), step 2) of forming photonic crystals 18 and photoluminescent blocks 16 comprising the steps of:

4) for the photoluminescent blocks of the first type:
4a) growing by epitaxy on a first substrate the stack of semiconductor layers forming the multiple quantum wells of the photoluminescent blocks of the first type all over the first substrate;
4b) etching the stack to delimit the photo-luminescent blocks of the first type;
4c) depositing a selective growth mask on the photoluminescent blocks of the first type;
4d) growing layer 98 by epitaxy on the first substrate between the photoluminescent blocks of the first type;
4e) forming openings 58 in the photoluminescent blocks of the first type;
4f) bonding, for example by molecular bonding or by using a bonding material, for example, a polymer, the structure obtained at step 4e), on the side of the photo-luminescent blocks 16 of the first type and of layer 98, to the structure obtained at step 1), the photoluminescent blocks of the first type and of the second type being aligned with the desired display sub-pixels; and
4g) removing the first substrate;
5) for the photoluminescent blocks of the second type:
5a) growing by epitaxy on a second substrate the stack of semiconductor layers forming the multiple quantum wells of the photoluminescent blocks of the second type all over the second substrate;
5b) etching the stack to delimit the photo-luminescent blocks of the second type;
5c) depositing a selective growth mask on the photoluminescent blocks of the second type;
5d) growing layer 96 by epitaxy on the second substrate between the photoluminescent blocks of the second type;
5e) forming openings 58 in the photoluminescent blocks of the second type;
5f) bonding, for example by molecular bonding or by using a bonding material, for example, a polymer, the structure obtained at step 5e), on the side of the photoluminescent blocks 16 of the second type and of layer 96, to the structure obtained at step 4g), the photo-luminescent blocks of the second type being aligned with the desired display sub-pixels; and
5g) removing the second substrate;
6) forming walls 20;
7) optionally removing the portions of layers 96 and 98 present on the sub-pixels which comprise no photoluminescent blocks.

Specific embodiments have been described. Various alterations and modifications will occur to those skilled in the art. In particular, although in the previously-described embodiments, walls 20 have lateral surfaces which are substantially perpendicular to surfaces 28 of light-emitting sources 14, the lateral surfaces of walls 20 may be profiled, for example inclined with respect to surfaces 28. Further, it is possible for the optoelectronic device to only comprise, for each display sub-pixel Pix, selective mirror 72 or selective mirror 74.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. An optoelectronic device comprising:
light-emitting sources, each light-emitting source being capable of emitting a first radiation at a first wavelength and comprising first and second opposite surfaces;
photoluminescent blocks distributed into first photoluminescent blocks capable of converting by optical pumping the first radiation into a second radiation at a second wavelength and second photoluminescent blocks capable of converting by optical pumping the first radiation into a third radiation at a third wavelength; and
for each photoluminescent block, an optical coupler comprising a first photonic crystal at least partially surrounding said photoluminescent block, both photonic crystal and photoluminescent block covering the first surface of one of the light-emitting sources, the photonic crystal and the photoluminescent block being the one next to the other on said first surface, both the photonic crystal and the photoluminescent block being in contact with said first surface, the optical coupler being capable of modifying the propagation direction of rays of the first radiation emitted by said light-emitting source to redirect the rays towards said photoluminescent block.

2. The optoelectronic device of claim 1, wherein each optical coupler comprises a first layer of a first material having a first refraction index at the first wavelength, the first layer having first and second opposite surfaces, the first or second surface covering said light-emitting source, each optical coupler further comprising first openings extending in the first layer from the first surface and/or the second surface and filled with a second material having a second refraction index at the first wavelength different from the first refraction index.

3. The optoelectronic device of claim 1, wherein each photoluminescent block comprises a second photonic crystal capable of giving way to the first radiation, the propagation speed of the first radiation in the photoluminescent block being smaller than the propagation speed of the first radiation in the optical coupler adjacent to said photo-luminescent block.

4. The optoelectronic device of claim 3, wherein each photoluminescent block comprises nanometer-range photoluminescent single-crystal particles of a semiconductor material.

5. The optoelectronic device of claim 3, wherein each photoluminescent block comprises a second layer of a third material having a third refraction index at the first wavelength, the second layer having third and fourth opposite surfaces, the third or fourth surface covering said light-emitting source, each photoluminescent block further comprising second openings extending in the second layer from the third and/or fourth surface and filled with a fourth material having a fourth refraction index at the first wavelength different from the third refraction index.

6. The optoelectronic device of claim 5, wherein the light-emitting single-crystal particles are located in the second layer and/or in the second openings.

7. The optoelectronic device of claim 1, further comprising, for each photoluminescent block, a first selective mirror interposed between said light source and said photoluminescent block, the first mirror being capable of giving way to the first radiation and of reflecting the second radiation and/or the third radiation.

8. The optoelectronic device of claim 7, wherein the first selective mirror comprises a third photonic crystal.

9. The optoelectronic device of claim 1, further comprising, for each photoluminescent block, a second selective mirror, said photoluminescent block being interposed between said light source and said second mirror, the second mirror being capable of reflecting the first radiation and of giving way to the second radiation and/or the third radiation.

10. The optoelectronic device of claim 1, further comprising third photoluminescent blocks capable of converting by optical pumping the first radiation into a fourth radiation at a fourth wavelength.

11. The optoelectronic device of claim 1, further comprising walls reflecting the first, second, and third radiations, said walls separating the light-emitting sources and separating the photoluminescent blocks.

12. The optoelectronic device of claim 1, wherein the light-emitting sources comprise light-emitting diodes or vertical cavity surface-emitting laser diodes.

13. A method of manufacturing the optoelectronic device of claim 1, comprising the steps of:
   a) forming the light-emitting sources;
   b) forming the photoluminescent blocks on the light-emitting sources; and
   d) forming the optical couplers on the light-emitting sources, each optical coupler at least partially surrounding one of the photoluminescent blocks.

* * * * *